US008912824B1

(12) United States Patent
Arp et al.

(10) Patent No.: US 8,912,824 B1
(45) Date of Patent: Dec. 16, 2014

(54) METHOD AND APPARATUS FOR DETECTING RISING AND FALLING TRANSITIONS OF INTERNAL SIGNALS OF AN INTEGRATED CIRCUIT

(71) Applicant: International Business Machines Corporation, Armonk, NY (US)

(72) Inventors: Andreas Arp, Nufringen (DE); Guenther Hutzl, Sindelfingen (DE); Michael Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/018,831

(22) Filed: Sep. 5, 2013

(51) Int. Cl.
*H03K 19/20* (2006.01)

(52) U.S. Cl.
USPC ............... 326/104; 326/46; 326/93; 327/170; 327/263

(58) Field of Classification Search
USPC ........... 326/46, 52, 54, 93, 104; 327/170, 263
See application file for complete search history.

(56) References Cited

U.S. PATENT DOCUMENTS

| 5,198,705 | A  | * | 3/1993 | Galbraith et al. | ............... 326/37 |
| 7,439,724 | B2 |   | 10/2008 | Heidel et al. | |
| 7,797,131 | B2 |   | 9/2010 | Singh et al. | |
| 7,944,299 | B2 |   | 5/2011 | Mangudi et al. | |
| 7,973,549 | B2 | * | 7/2011 | Joshi et al. | ............... 324/762.01 |
| 2003/0085734 | A1 | * | 5/2003 | Nguyen | .......................... 326/46 |

FOREIGN PATENT DOCUMENTS

CN     102073008 B     5/2013

OTHER PUBLICATIONS

Franch, et al., "On-chip Timing Uncertainty Measurements on IBM Microprocessors", International Test Conference, © 2007 IEEE, 7 pages.

* cited by examiner

*Primary Examiner* — Jason M Crawford
(74) *Attorney, Agent, or Firm* — Edward Li

(57) ABSTRACT

A method and apparatus for detecting rising and falling transitions of internal signals of an array or integrated circuit. The apparatus comprises a delay line with a plurality of first to Nth delay elements, latches, and first to Nth groups of logic gates. Each of the first to Nth groups of the logical gates includes an AND gate and a NOR gate. The method and apparatus determines rising and falling signals based on output signals of the logic gates; in odd numbered groups of the logic gates, the AND gate detects the rising transition and the NOR gate detects the falling transition; in even numbered groups of the logic gates, the AND gate detects the falling transition and the NOR gate detects the rising transition.

8 Claims, 4 Drawing Sheets

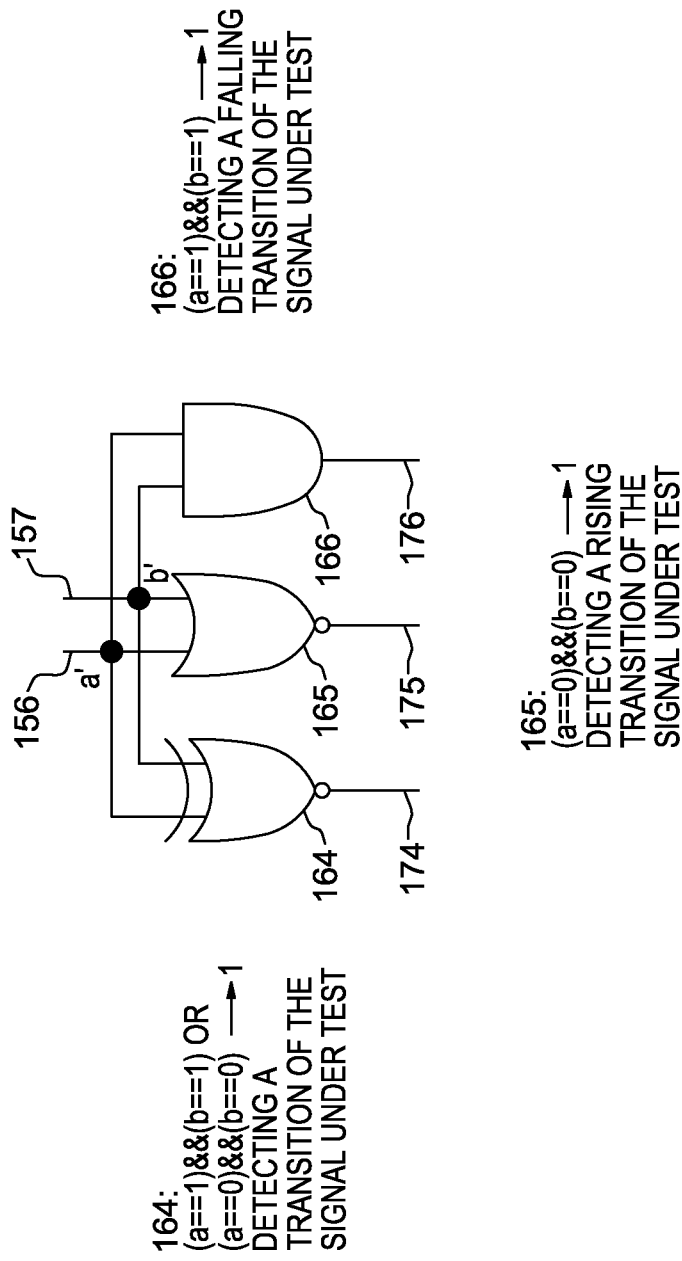

METHOD AND APPARATUS FOR DETECTING RISING AND FALLING TRANSITIONS OF INTERNAL SIGNALS OF AN INTEGRATED CIRCUIT

FIELD OF THE INVENTION

The present invention relates generally to circuit testing, and more particularly to detecting rising and falling transitions of internal signals of an array or integrated circuit.

BACKGROUND

For determining circuit functionality, stability, and reliability, measurement of internal signals in memory devices, logic circuits, or other integrated circuits is useful. The measurement of internal signals provides information about the operation and function of an integrated circuit; the information can be used to diagnose problems in the operation or design of the integrated circuits. Previously disclosed circuits for measuring periodic signals, as a component of the integrated circuit, are designed for on-chip measurement of skew and jitter in the internal signals. The previously disclosed circuits can detect transitions of the periodic signals but cannot identify whether the transitions are rising or falling transitions.

SUMMARY

Embodiments of the present invention provide an apparatus for detecting a rising transition and a falling transition of an internal signal of an integrated circuit. The apparatus comprises a delay line which includes first to Nth delay elements (N is an integer greater than 1) and in which the first delay element receives the internal signal. The apparatus further comprises latches whose respective inputs connect to an input of the first delay element, between two adjacent ones of the delay elements, and an output of the Nth delay elements. The apparatus further comprises first to Nth groups of logic gates, each of which includes an AND gate and a NOR gate. First inputs of the logic gates in the first to Nth groups connect to outputs of the respective ones of the first latches so as to detect signals at inputs of the first to Nth delay elements, respectively. Second inputs of the logic gates in the first to Nth groups connect to the outputs the respective ones of the first latches so as to detect signals at outputs of the first to Nth delay elements, respectively. In odd numbered groups of the logic gates, the AND gate detects the rising transition and the NOR gate detects the falling transition. In even numbered groups of the logic gates and the AND gate detects the falling transition, the NOR gate detects the rising transition.

Embodiments of the present invention provide a method for detecting a rising transition and a falling transition of an internal signal of an integrated circuit. An apparatus receives the internal signal by a delay line which includes first to Nth delay elements (N is an integer greater than 1) and in which the first delay element receives the internal signal. The apparatus passes signals from the delay line through first latches whose respective inputs connect to an input of the first delay element, between two adjacent ones of the delay elements, and an output of the Nth delay elements. The apparatus passes signals from the respective ones of the first latches through respective ones of first to Nth groups of logic gates, each of which includes an AND gate and a NOR gate. First inputs of the logic gates in the first to Nth groups connect to outputs of the respective ones of the first latches so as to detect signals at inputs of the first to Nth delay elements, respectively. Second inputs of the logic gates in the first to Nth groups connect to the outputs the respective ones of the first latches so as to detect signals at outputs of the first to Nth delay elements, respectively. The apparatus determines the rising transition and the falling transition based on output signals of the AND gate and the NOR gate; in odd numbered groups of the logic gates of the apparatus, the AND gate detects the rising transition and the NOR gate detects the falling transition; in even numbered groups of the logic gates of the apparatus, the AND gate detects the falling transition and the NOR gate detects the rising transition.

BRIEF DESCRIPTION OF THE SEVERAL VIEWS OF THE DRAWINGS

FIG. 1C is a schematic diagram showing the logic of a second group of logic gates in the circuit shown in FIG. 1A, in accordance with a first exemplary embodiment of the present invention.

DETAILED DESCRIPTION

Figure 1A:
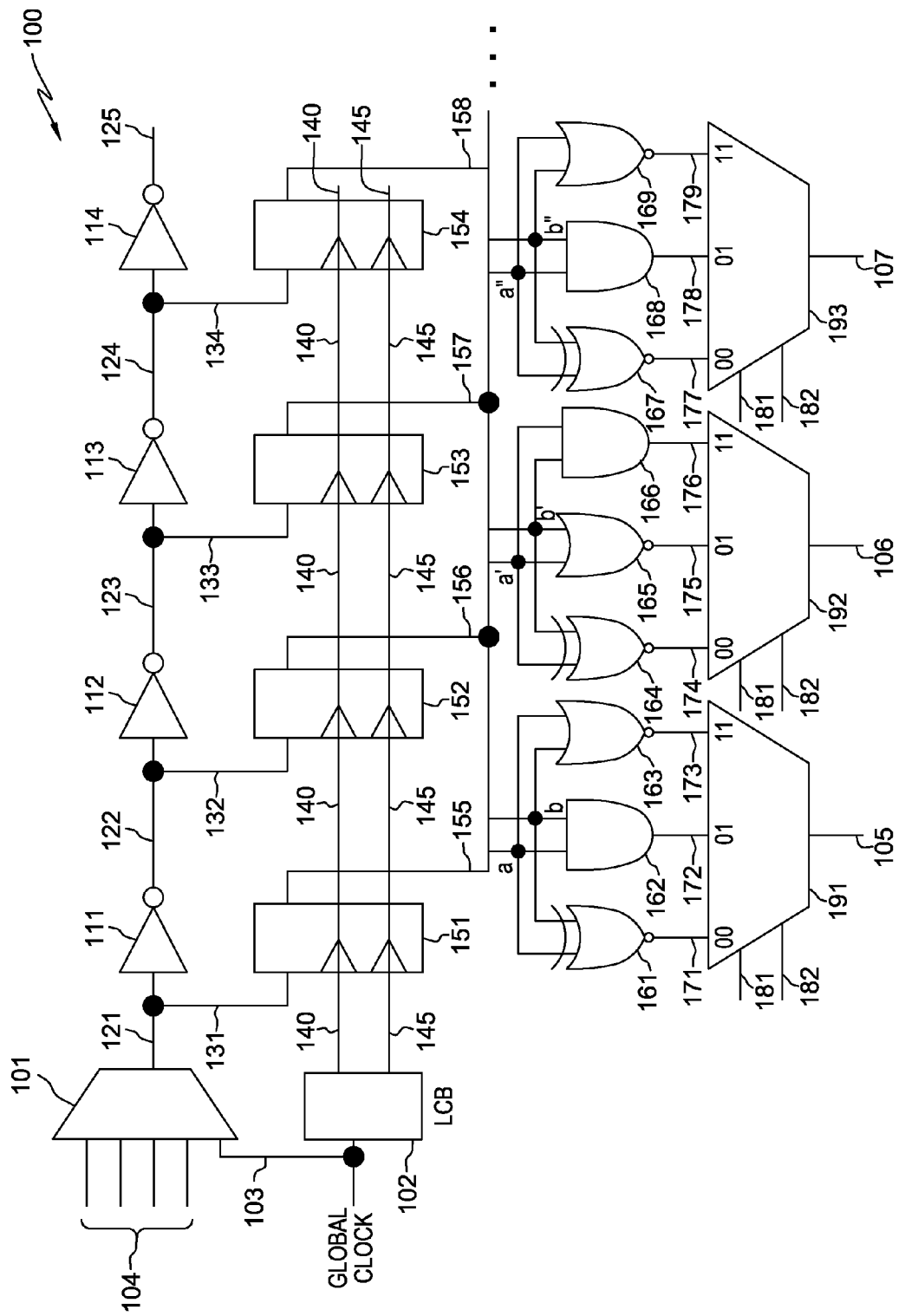
FIG. 1A is a schematic diagram showing a circuit for measuring rising and falling transitions, in accordance with a first exemplary embodiment of the present invention.

FIG. 1A is a schematic diagram showing circuit 100 for measuring rising and falling transitions, in accordance with a first exemplary embodiment of the present invention. Circuit 100 comprises a delay line which includes a plurality of delay elements in series. As shown in FIG. 1A, the output of delay element 111 connects through connection 122 to the input of delay element 112, the output of delay element 112 connects through connection 123 to the input of delay element 113, the output of delay element 113 connects through connection 124 to the input of delay element 114, the output of delay element 114 connects through connection 125 to the input of the next delay element, and the pattern repeats in the delay line. In the exemplary embodiment, the delay elements are inverters. In other embodiments, other types of delay elements, such as inverting transmission gates, stacked inverters, and logic gates, may be used. The input of delay element 111 connects trough connection 121 to the output of multiplexer 101. Inputs 104 of multiplexer 101 receive internal signals of an integrated circuit. Input 103 of multiplexer 101 connects to a global clock which may be a chip clock or even a local clock for a portion of the integrated circuit.

Referring to FIG. 1A, circuit 100 further comprises a plurality of latches. A data input of each of the latches is connected to a connection between two adjacent ones of the delay elements mentioned above. As shown in FIG. 1A, the data input of latch 151 connects through connection 131 to connection 121, the data input of latch 152 connects through connection 132 to connection 122, the data input of latch 153 connects through connection 133 to connection 123, and the data input of latch 154 connects through connection 134 to connection 124. More latches are in circuit 100, following the connection patterns of latches 151, 152, 153, and 154. The number of the latches in circuit 100 corresponds with the structure or bandwidth of a given circuit.

The latches (latches 151, 152, 153, and 154 shown in FIG. 1) are clocked in accordance with local clock buffer (LCB) 102 which is derived from the global clock. In the exemplary embodiment, the global clock is split in LCB 102 such that the first clock is a data capture clock and the second clock is a data launch clock. The data capture clock connects to the latches through connection 140, and the data launch clock through connection 145. In the exemplary embodiment, the data capture clock through connection 140 operates a master latch in each of the latches, while the data launch clock through connection 145 operates a slave latch in each of the latches. The rising edge of the clock may trigger the master latch, and the falling edge of the clock may trigger the slave latch. In other embodiments, master and slave latches in the latches are operated by only one clock.

Referring to FIG. 1A, circuit 100 further comprises a plurality of groups of logic gates and a plurality of multiplexers. The groups connect to the respective multiplexers. A respective one of the multiplexers is responsible for selecting one of outputs of the respective logic gates in a respective one of the groups.

As shown in FIG. 1A, the first group of logic gates comprises XNOR gate 161, AND gate 162, and NOR gate 163. For each of the logic gates, one input, a, connects through connection 155 to the output of latch 151, the other input, b, connects through connection 156 to the output of latch 152. Therefore, input a of the logic gates detects the input of delay element 111, while input b of the logic gates detects the output of delay element 111. The output of XNOR gate 161 connects to input 171 of multiplexer 191, the output of AND gate 162 connects to input 172 of multiplexer 191, and the output of NOR gate 163 connects to input 173 of multiplexer 191. Multiplexer 191 selects one of the outputs of XNOR gate 161, AND gate 162, and NOR gate 163, by two bit selections. In an example, when both selection 181 and selection 182 are 0 (two bits are 00), multiplexer 191 picks the output of XNOR gate 161 and therefore the signal at output 105 of multiplexer 191 is the signal of the output of XNOR gate 161; when selection 181 is 0 and selection 182 is 1 (two bits are 01), multiplexer 191 picks the output of AND gate 162 and therefore the signal at output 105 of multiplexer 191 is the signal of the output of AND gate 162; when both selection 181 and selection 182 are 11 (two bits are 11), multiplexer 191 picks the output of NOR gate 163 and therefore the signal at output 105 of multiplexer 191 is the signal of the output of NOR gate 163.

As shown in FIG. 1A, the second group of logic gates comprises XNOR gate 164, NOR gate 165, and AND gate 166. For each of the logic gates, one input, a', connects through connection 156 to the output of latch 152, the other input, b', connects through connection 157 to the output of latch 153. Therefore, input a' of the logic gates detects the input of delay element 112, while input b' of the logic gates detects the output of delay element 112. In the second group, the output of XNOR gate 164 connects to input 174 of multiplexer 192. In both the first and the second groups, the pattern of connection of the output of an XNOR gate to an input of a multiplexer is the same. Therefore, multiplexer 192 picks the output of XNOR gate 164 as output 106 of multiplexer 192 when both selection 181 and selection 182 are 0 (two bits are 00). In the second group, the output of NOR gate 165 connects to input 175 of multiplexer 192 and the output of AND gate 166 connects to input 176 of multiplexer 192. Comparing the first and second groups in FIG. 1A, it is noticed that two different groups have different ways of the connections of an AND gate and a NOR gate to inputs of a multiplexer. In the second group, for example, multiplexer 192 picks the output of NOR gate 165 (instead of an AND gate as in the first group) as output 106 of multiplexer 192 when selection 181 is 0 and selection 182 is 1 (two bits are 01), and multiplexer 192 picks the output of AND gate 166 (instead of a NOR gate as in the first group) as output 106 of multiplexer 192 when both selection 181 selection 182 are 1 (two bits are 11).

As shown in FIG. 1A, the third group of logic gates comprises XNOR gate 167, AND gate 168, and NOR gate 169. For each of the logic gates, one input, a", connects through connection 157 to the output of latch 153, the other input, b", connects through connection 158 to the output of latch 154. Thus, input a" of the logic gates detects the input of delay element 113, while input b" of the logic gates detects the output of delay element 113. In the third group, the connection patterns between logic gates (XNOR gate 167, AND gate 168, and NOR gate 169) and inputs (inputs 177, 178, and 179) of a multiplexer (multiplexer 193) are identical to those in the first group. The operation patterns of multiplexer 193 are the same as those of multiplexer 191. In an example, when both selection 181 and selection 182 are 0 (two bits are 00), multiplexer 193 picks the output of XNOR gate 167 as output 107 of multiplexer 193; when selection 181 is 0 and selection 182 is 1 (two bits are 01), multiplexer 193 picks the output of AND gate 168 as output 107 of multiplexer 193; when both selection 181 and selection 182 are 11 (two bits are 11), multiplexer 193 picks the output of NOR gate 169 as output 107 of multiplexer 193.

In circuit 100, more groups of logic gates are added after the third group in corresponding to more latches and delay elements in the circuit structure. The connection pattern between fourth group of logic gates and its corresponding multiplexer is identical to that between the second group (XNOR gate 164, NOR gate 165, and AND gate 166) and multiplexer 192. In general, the odd numbered groups (first, third, fifth, . . . ) have a first type of connection patterns between the logic gates and the inputs of a multiplexer, like the connections between XNOR gate 161 and input 171 of multiplexer 191, between AND gate 162 and input 172, and between NOR gate 163 and input 173. The even numbered groups (second, fourth, sixth, . . . ) have a second type of connection patterns between the logic gates and the inputs of a multiplexer, like the connections between XNOR gate 164 and input 174 of multiplexer 192, between NOR gate 165 and input 175, and between AND gate 166 and input 176.

In the exemplary embodiment, the internal signals of the integrated circuit running through inputs 104 of multiplexer 101 are multiplexed with the global clock signal running through input 103 of multiplexer 101. A respective one of the internal signals or the global clock is a signal under test. The signal under test running through one of inputs 104 or input 103 is input to circuit 100 for detection of a transition, a rising transition, or a falling transition. At a first stage of detecting transactions of the internal signals, the global clock signal is run through circuit 100 to determine the transition to calibrate a clock period of the global clock signal. This is performed at a known input clock speed, e.g., a clock generated by a ring oscillator or other clocking device. The clock calibration is employed to calibrate the global clock. At this stage, transitions are obtained and pulse measurements are performed for the global clock signal. At a second stage of detecting transactions of the internal signals, multiplexer 101 switches to a respective one of the internal signals.

Figure 1B:
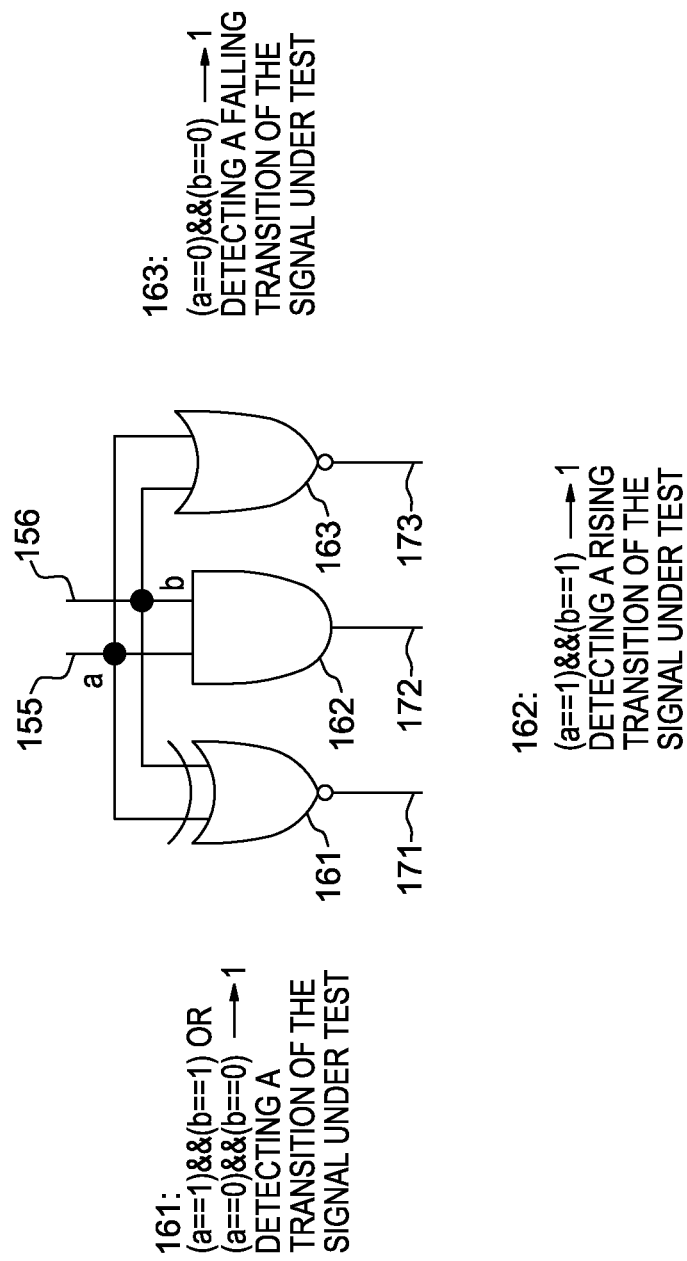
FIG. 1B is a schematic diagram showing the logic of a first group of logic gates in the circuit shown in FIG. 1A, in accordance with a first exemplary embodiment of the present invention.

FIG. 1B is a schematic diagram showing the logic of a first group of logic gates (XNOR gate 161, AND gate 162, and NOR gate 163) in circuit 100 shown in FIG. 1A, in accordance with a first exemplary embodiment of the present invention. XNOR gate 161 detects a transition of a signal under test. It should be pointed out that XNOR gate 161 cannot detect whether the transition is a rising or falling transition. When the transition occurs, signals are "1" and "1" at both the input and the output of delay element 111, or signals are "0" and "0" at both the input and the output of delay element 111. Thus, signals at the inputs (a and b) of XNOR gate 161 are "1 and 1" or "0 and 0", i.e., (a==1)&&(b==1) or (a==0)&&(b==0). The output of XNOR gate 161, therefore, is "1".

Referring to FIG. 1B, AND gate 162 detects a rising transition of the signal under test. When the rising transition occurs, signals are "1" and "1" at both the input and the output of delay element 111. Thus, the signals at the inputs (a and b) of AND gate 162 are "1" and "1", i.e., (a==1)&&(b==1). The output of AND gate 162, therefore, is "1".

Referring to FIG. 1B, NOR gate 163 detects a falling transition of the signal under test. When the falling transition occurs, signals are "0" and "0" at both the input and the output of delay element 111. Thus, the signal at the inputs (a and b) of NOR gate 163 are "0" and "0", i.e., (a==0)&&(b==0). The output of NOR gate 163, therefore, is "1".

In general, in the odd-numbered groups (first, third, fifth, . . . ) of logic gates in circuit 100, an AND gate (such as AND gate 162 in the first group or 168 in the third group) detects a rising transition of the signal under test, while a NOR gate (such as NOR gate 163 in the first group or 169 in the third group) detects a falling transition of the signal under test.

FIG. 1C is a schematic diagram showing the logic of a second group of logic gates (XNOR gate 164, NOR gate 165, and AND gate 166) in circuit 100 shown in FIG. 1A, in accordance with a first exemplary embodiment of the present invention. Same as XNOR gate 161 in the first group, XNOR gate 164 detects a transition of the signal under test but cannot detect whether the transition is a rising or falling transition. When the transition occurs, the signals are "1" and "1" at both the input and the output of delay element 112, or the signals are "0" and "0" at both the input and the output of delay element 112. Thus, the signals at inputs a' and b' of XNOR gate 164 are "1 and 1" or "0 and 0", i.e., (a'==1)&&(b'==1) or (a'==0)&&(b==0'). The output of XNOR gate 164, therefore, is "1".

Referring to FIG. 1C, NOR gate 165 detects a rising transition of the signal under test. It should be pointed out that NOR gate 165 in the second group and NOR gate 163 in the first group detect different types of transitions. NOR gate 165 detects a rising transition of the signals under test, while NOR gate 163 detects a falling transition. The signal of the rising transition is inverted at both the input and the output of delay element 112; therefore, when the rising transition of the signal under test occurs, the signals at both the input and the output of delay element 112 are "0" and "0". Thus, the signals at inputs a' and b' of NOR gate 165 are "0" and "0", i.e., (a'==0)&&(b'==0). As a result, the output of NOR gate 165 is "1".

Referring to FIG. 1C, AND gate 166 detects a falling transition of the signal under test. It should be pointed out that AND gate 166 in the second group and AND gate 162 in the first group detect different types of transitions. AND gate 166 detects a falling transition of the signals under test, while AND gate 162 detects a rising transition. The signal of the falling transition is inverted at both the input and the output of delay element 112; therefore, when the falling transition of the signal under test occurs, the signals at both the input and the output of delay element 112 are "1" and "1". Thus, the signals at inputs a' and b' of AND gate 166 are "1" and "1", i.e., (a'==1)&&(b'==1). As a result, the output of AND gate 166 is "1".

In general, in the even-numbered groups (second, fourth, sixth, . . . ) of logic gates in circuit 100, a NOR gate (such as NOR gate 165 in the second group) detects a rising transition of the signal under test, while an AND gate (such as AND gate 166 in the second group) detects a falling transition of the signal under test.

Figure 2:
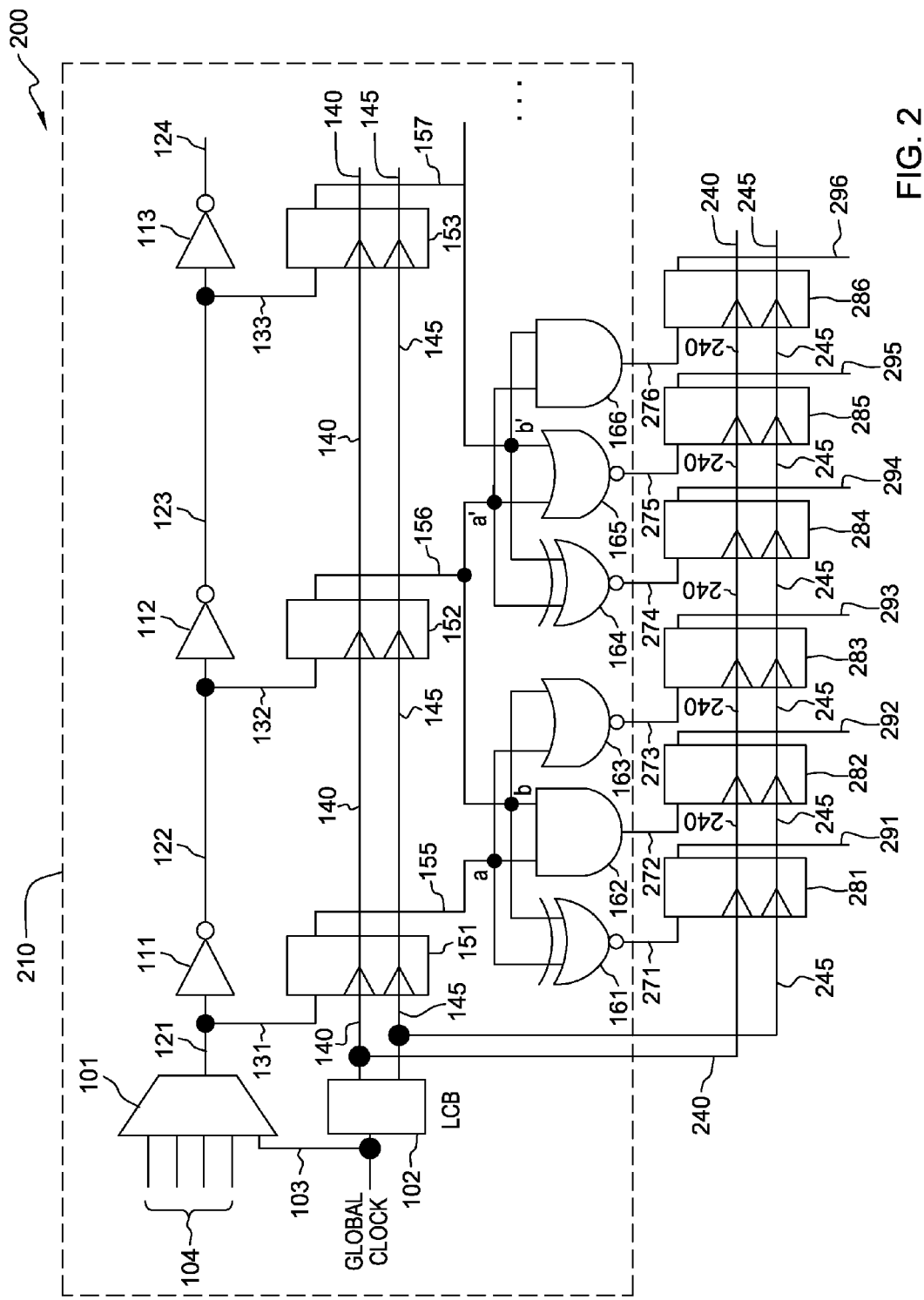
FIG. 2 is a schematic diagram showing a circuit for measuring rising and falling transitions, in accordance with a second exemplary embodiment of the present invention.

FIG. 2 is a schematic diagram showing circuit 200 for measuring rising and falling transitions, in accordance with a second exemplary embodiment of the present invention. Same as circuit 100 shown in FIG. 1A, circuit 200 comprises a delay line which includes a plurality of delay elements in series, a plurality of latches, and a plurality of groups of logic gates. In circuit 200 shown in FIG. 2, all elements enclosed within dashed-line 210 have been discussed in previous paragraphs with reference to FIGS. 1A, 1B, and 1C.

Referring to FIG. 2, circuit 200 further comprises a plurality of latches connecting to outputs of respective ones of the logic gates. As shown in FIG. 2, input 271 of latch 281 connects to the output of XNOR gate 161 in the first group of logic gates, output 291 of latch 281 detects the output signal of XNOR gate 161; input 272 of latch 282 connects to the output of AND gate 162 in the first group, output 292 of latch 282 detects the output signal of AND gate 162; input 273 of latch 283 connects to the output of NOR gate 163 in the first group, output 293 of latch 283 detects the output signal of NOR gate 163. As shown in FIG. 2, input 274 of latch 284 connects to the output of XNOR gate 164 in the second group of logic gates, output 294 of latch 284 detects the output signal of XNOR gate 164; input 275 of latch 285 connects to the output of NOR gate 165 in the second group, output 295 of latch 285 detects the output signal of NOR gate 165; input 276 of latch 286 connects to the output of AND gate 166 in the second group, output 296 of latch 286 detects the output signal of AND gate 166. More such latches are in circuit 200 for more logic gates, following the patterns shown in FIG. 2.

Latches 281 through 286 shown in FIG. 2 are clocked in accordance with local clock buffer (LCB) 102 which is derived from the global clock. The data capture clock is connected to the latches through connection 240, and the data launch clock through connection 245. In the exemplary embodiment, the data capture clock through connection 240 operates a master latch in the latches and the data launch clock through connection 245 operates a slave latch in the latches. The rising edge of the clock may trigger the master latch, and the falling edge of the clock may trigger the slave latch. In other embodiments, master and slave latches in the latches are operated by only one clock.

Referring FIG. 2, the advantage of circuit 200 is that all transitions can be simultaneously observed from the outputs of the multiplexers, such as outputs 291 through 296 shown in FIG. 2.

Based on the foregoing, a method and apparatus for detecting rising and falling edges have been disclosed. However, numerous modifications and substitutions can be made without deviating from the sprit and scope of the present invention. Therefore, the present invention has been disclosed by way of examples and not limitation.

What is claimed is:

1. An apparatus for detecting a rising transition and a falling transition of an internal signal of an integrated circuit, the apparatus comprising:
   a delay line comprising first to Nth delay elements in series, N being an integer greater than 1, the first delay element receiving the internal signal;

first latches, inputs of respective ones of the first latches connecting to an input of the first delay element, between two adjacent ones of the delay elements, and an output of the Nth delay elements;

first to Nth groups of logic gates, each of the first to Nth groups comprising an AND gate and a NOR gate;

wherein first inputs of the logic gates in the first to Nth groups connect to outputs of the respective ones of the first latches so as to detect signals at inputs of the first to Nth delay elements, respectively;

wherein second inputs of the logic gates in the first to Nth groups connect to the outputs the respective ones of the first latches so as to detect signals at outputs of the first to Nth delay elements, respectively;

wherein, in odd numbered groups of the logic gates, the AND gate detects the rising transition, the NOR gate detects the falling transition; and wherein, in even numbered groups of the logic gates, the AND gate detects the falling transition, the NOR gate detects the rising transition.

2. The apparatus of claim 1, wherein the first to Nth delay elements are inverters.

3. The apparatus of claim 1, wherein the first latches are clocked in accordance with a local clock buffer which is derived from a global clock on the integrated circuit.

4. The apparatus of claim 1, further comprising:
first to Nth multiplexers, the first to Nth multiplexers connecting respectively to the first to Nth groups of the logic gates; and wherein, outputs of respective ones of the logic gates in a respective one of the first to Nth groups are multiplexed by a respective one of the first to Nth multiplexers.

5. The apparatus of claim 1, further comprising:
second latches, inputs of respective ones of the second latches connecting to outputs of respective ones of the logic gates; and wherein the outputs of the respective ones of the logic gates are detected at outputs of the respective ones of the second latches.

6. The apparatus of claim 5, wherein the second latches are clocked in accordance with a local clock buffer which is derived from a global clock on the integrated circuit.

7. The apparatus of claim 1, further comprising:
a multiplexer connecting to the input of the first delay element; and wherein multiple internal signals of the integrated circuit and a global clock signal are multiplexed by the multiplexer.

8. The apparatus of claim 1, further comprising:
an XNOR gate in each of the first to Nth groups; and wherein the XNOR gate detects a transition of the internal signal.

* * * * *